United States Patent
Hummler et al.

(10) Patent No.: US 7,975,170 B2
(45) Date of Patent: Jul. 5, 2011

(54) MEMORY REFRESH SYSTEM AND METHOD

(75) Inventors: Klaus Hummler, Apex, NC (US); Jong Hoon Oh, Chapel Hill, NC (US); Wayne Frederick Ellis, Jericho, VT (US); Jung Pill Kim, Cary, NC (US); Oliver Kiehl, Charlotte, VT (US); Josef Schnell, Charlotte, VT (US); Octavian Beldiman, South Burlington, VT (US); Lee Ward Collins, Cary, NC (US)

(73) Assignee: Qimonda AG, Munich (DE)

( * ) Notice: Subject to any disclaimer, the term of this patent is extended or adjusted under 35 U.S.C. 154(b) by 541 days.

(21) Appl. No.: 11/763,593

(22) Filed: Jun. 15, 2007

(65) Prior Publication Data

US 2008/0313494 A1 Dec. 18, 2008

(51) Int. Cl.
G06F 11/00 (2006.01)
(52) U.S. Cl. .............................. 714/8; 711/106
(58) Field of Classification Search .......... 714/8
See application file for complete search history.

(56) References Cited

U.S. PATENT DOCUMENTS

| | | | |
|---|---|---|---|
| 4,316,248 A * | 2/1982 | Retter | 714/22 |
| 4,493,081 A * | 1/1985 | Schmidt | 714/754 |
| 4,933,907 A * | 6/1990 | Kumanoya et al. | 365/222 |
| 4,935,900 A | 6/1990 | Ohsawa | |
| 4,956,820 A * | 9/1990 | Hashimoto | 365/222 |
| 4,982,369 A * | 1/1991 | Tatematsu | 365/222 |
| 5,406,522 A * | 4/1995 | Hirano | 365/222 |
| 5,446,695 A | 8/1995 | Douse et al. | |
| 5,532,968 A * | 7/1996 | Lee | 365/222 |
| 5,933,377 A * | 8/1999 | Hidaka | 365/200 |
| 6,199,139 B1 | 3/2001 | Katayama et al. | |
| 7,072,233 B2 | 7/2006 | Brede et al. | |
| 7,477,563 B2 * | 1/2009 | Kang et al. | 365/222 |
| 7,543,106 B2 * | 6/2009 | Choi | 711/106 |
| 7,603,512 B2 * | 10/2009 | Seo | 711/106 |
| 2005/0108460 A1 * | 5/2005 | David | 711/5 |
| 2005/0281112 A1 * | 12/2005 | Ito et al. | 365/222 |
| 2006/0044912 A1 * | 3/2006 | Kim et al. | 365/222 |
| 2006/0067150 A1 * | 3/2006 | Jain et al. | 365/222 |
| 2006/0294296 A1 * | 12/2006 | Teng | 711/106 |
| 2007/0022244 A1 * | 1/2007 | Kimmery | 711/106 |
| 2007/0106838 A1 * | 5/2007 | Choi | 711/106 |

* cited by examiner

*Primary Examiner* — Scott T Baderman
*Assistant Examiner* — Kamini Patel
(74) *Attorney, Agent, or Firm* — Dicke, Billig, & Czaja, PLLC (57) ABSTRACT

A refresh scheduler is configured to refresh memory cells of a memory device according to a plurality of refresh intervals. The various refresh intervals are determined in response to refresh errors.

19 Claims, 5 Drawing Sheets

MEMORY REFRESH SYSTEM AND METHOD

BACKGROUND

In general, a dynamic random access memory (DRAM) device includes memory cells arranged in rows and columns in an array, with the rows extending along an x-direction and the columns extending along a y-direction. Conductive word lines, or pages, extend across the array of memory cells along the x-direction and conductive bit lines extend across the array of memory cells along the y-direction. A memory cell is located at each cross point of a word line and a bit line. Memory cells are accessed using a row address and a column address.

DRAM memory cells are essentially made up of a capacitor, and data are stored in the DRAM memory cells in the form of electric charges. Data retention time is therefore limited, since over time a stored charge gradually leaks off. To prevent data corruption, the charge must be periodically refreshed. The time within which a refresh must be performed to prevent such data corruption is commonly referred to as the refresh interval. To refresh data in a memory array, the array is typically placed in a read mode to obtain the present data stored in a row of memory cells, or page. Subsequently, these data are used as new input data that is re-written to the page, thus maintaining the stored data.

Extending the refresh interval (reducing the refresh frequency) consumes less power, which of course is desirable in low power applications. However, if the refresh interval is extended beyond the data retention time, errors can occur resulting in reduced data quality. On the other hand, setting a short refresh interval helps maximize quality, but can result in excess power consumption.

Known DRAM devices typically have a fixed refresh interval setting for all pages when in self refresh. Refreshing all-pages in a DRAM with the same refresh interval is not optimized because not all pages exhibit the same retention time. Known methods of adjusting refresh intervals based on retention test results are fail to adjust to possible changes in retention behavior of the DRAM and retention requirements in the field. As a consequence, the trade-off between extended refresh interval (reduced power consumption) and reduced failure rate (quality) in the system is not optimized.

SUMMARY

In accordance with embodiments of the present invention, a memory device includes an array containing a plurality of memory locations. A refresh scheduler is configured to refresh the memory locations according to a plurality of refresh intervals.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
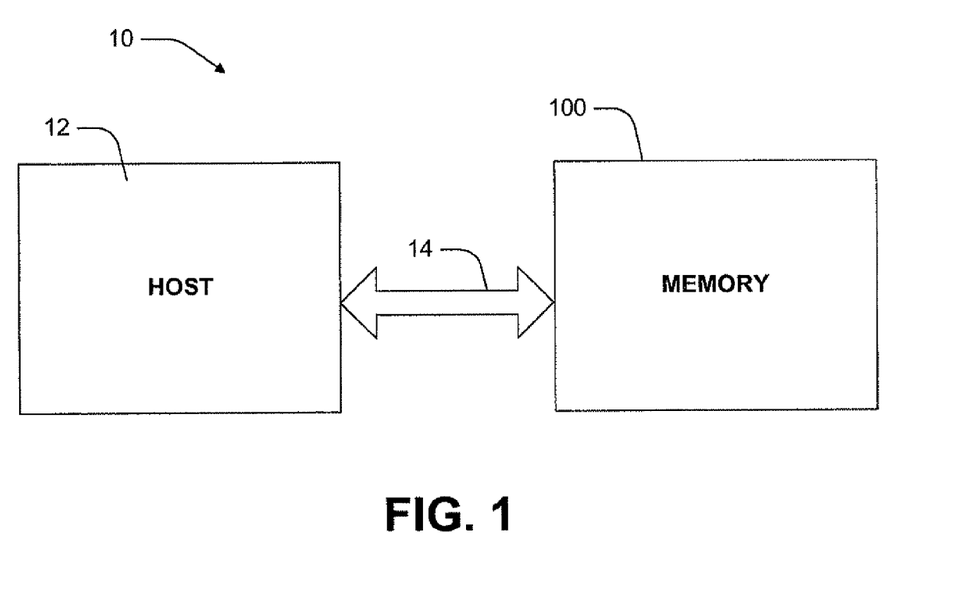
FIG. 1 is a block diagram illustrating portions of a system in accordance with embodiments of the present invention.

FIG. 1 is a block diagram illustrating an exemplary embodiment of a system 10 in accordance with aspects of the present invention. The system 10 includes a host device 12 and a memory system 100. The host 12 is electrically coupled to the memory 100 through a memory communication path 14. The host system 12 may comprise, for example, a computer system, mobile phone system, personal digital assistant (PDA), etc. which typically include a microprocessor or other suitable device capable of communicating with the memory system 100 though the memory communication path 14 to read data from and write data to the memory 100.

Figure 2:
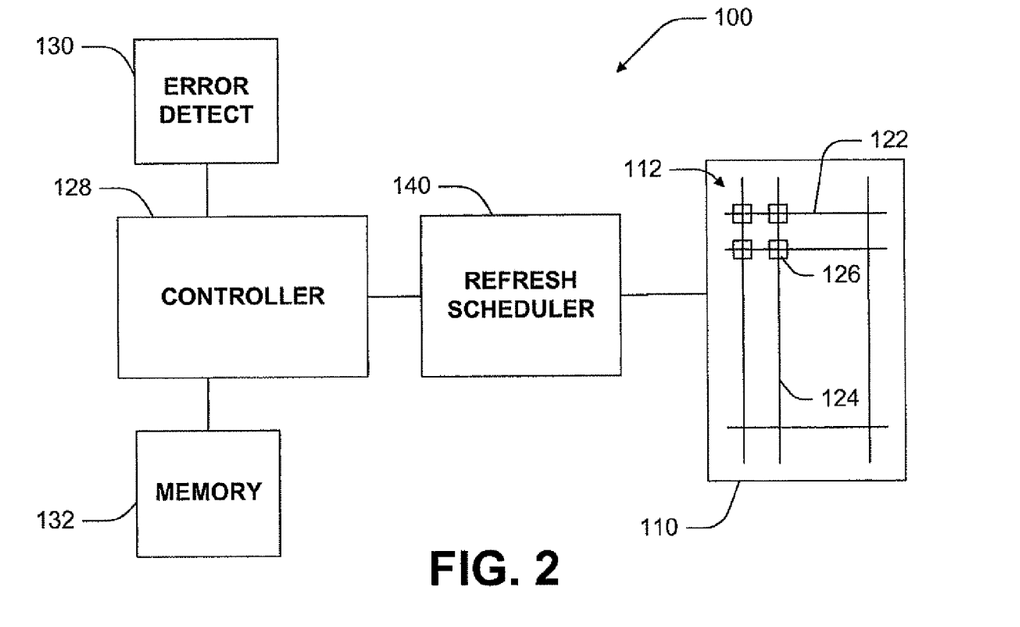
FIG. 2 is a block diagram illustrating portions of a memory system in accordance with embodiments of the present invention.

FIG. 2 is a block diagram generally illustrating portions of the memory system 100 according to an embodiment of the invention. In this exemplary embodiment, the memory system 100 includes a memory device, such as a dynamic random access memory (DRAM) 110 with self refresh capabilities. The illustrated DRAM 110 includes a memory array 112 having conductive wordlines 122, or pages, that extend in the x-direction across the memory array 112. Conductive bitlines 124, sometimes referred to as column select lines, extend in the y-direction. A memory cell 126 is located at each wordline 122 and bitline 124 intersection.

A memory controller 128 is configured to write information into and read information from the DRAM 110 in response to write and read transactions, respectively, from devices connected to the controller 128, such as the host system 10. The system 100 includes some form of an error detection and/or correction device, such as an error correction circuit (ECC) 130 that determines if data have been corrupted. The error detection device 130 compares parity information originally calculated to the tested parity information and determines whether an error has occurred. For example, if the refresh interval is too slow, the charge stored at a given memory cell 126 may leak to the point of causing a data error before the page 122 has been refreshed. With an ECC, if an error is detected the ECC device corrects the data. In the exemplary embodiment shown FIG. 1, the error detection device 130 is shown connected to the controller 128 external to the DRAM 110. In other embodiments, the error correction device 130 can be implemented on the DRAM 110 or be integrated with the controller 128.

A refresh scheduler 140 executes refreshes to the memory cells according to fail information, which is generated by the error correction device 130 in the illustrated embodiment. The refresh scheduler 140 is shown coupled to the controller 128, though it could be implemented as part of the controller 128, which ultimately issues the refresh commands. In accordance with certain embodiments of the present invention, the memory system 100 "learns" the best refresh interval setting for all pages 122 in the array 112. The self refresh operation can then be optimized. For example, a quality vs. power operating point can be determined that best fits the particular application in which the system 100 is employed.

In general, fail information for the refresh pages is generated by recording fail information. The fail information can be generated, for example, during a test mode, during operation of the memory system 100, during a self-refresh mode, etc. The fail information for each refresh page 122 gets stored temporarily or permanently in some storage medium, such as a non-volatile memory 132. In FIG. 2, the memory 132 is shown connected to the controller 128 external to the DRAM 110. A memory could alternatively be located in other locations, such as on the DRAM 110 or the host device 12 for storing fail information. The fail information is used to determine refresh interval information for each page 122 of the DRAM 110. This could simply be a single bit indicator in which a logic 0 represents a slow refresh interval and logic 1 represents a fast refresh interval. With additional bits, more refresh speeds can be encoded. The refresh interval information for each page is stored. In the current example, this information is stored in the non-volatile memory 132. The information may also be stored temporarily.

The refresh scheduler 140 executes refreshes to pages 122 according to the refresh interval prescribed in the information stored in the memory 132. Since DRAM retention times are sensitive to temperature, retention testing should happen under controlled conditions unless the system 100 has the capability to adjust the self refresh rate in response to temperature variations.

In the training mode, the system 100 adjusts refresh intervals in response to circumstances required by the particular application or based on specifications provided by a user. Refresh intervals can be established according to any of several different situations or conditions. For example, there are trade-offs associated with data quality vs. power consumption. In accordance with embodiments of the present invention, different training modes establish varying refresh intervals that optimize data quality or minimize refresh power, depending on requirements of the particular memory implementation.

Figure 3:
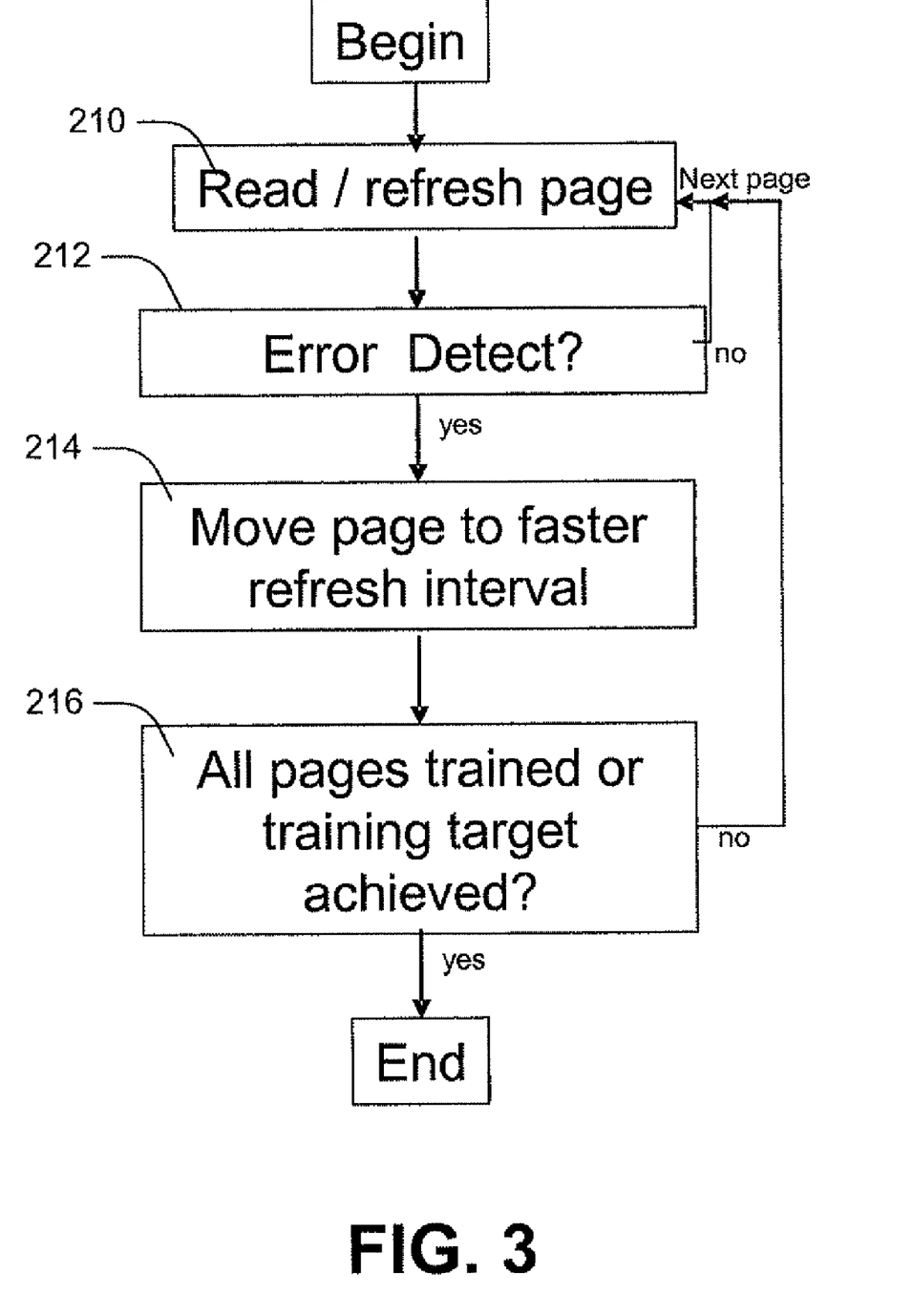
FIG. 3 is a flow diagram illustrating a process for determining refresh intervals.

FIG. 3 is a flow diagram illustrating an exemplary process for a "high quality" training mode, wherein refresh intervals are established to minimize data errors. The training process can start from any initial configuration. For example, the initial refresh intervals can be set by the manufacturer, or the initial configuration could be the result of an earlier training process. In block 210, a given page 122 is read and refreshed. When in the high quality training mode, the system 100 will decrease the DRAM refresh interval (faster refresh interval—shorten the time between refreshes) for a refresh page 122 that exhibits a fail as indicated by the error detection device 130. In certain embodiments, several refresh speed categories are defined, and any refresh page 122 exhibiting a fail is moved to the next faster refresh interval category as shown in Block 214. If an error is not detected in block 212, the next page is read and refreshed in block 210. This process is continued until no fails are observed or until a predetermined number of pages 122 are sorted into a certain refresh interval category as shown in block 216.

The high quality training could also be performed with guard bands applied to refresh time or temperature to achieve even higher quality. When the DRAM 110 is operated according to the high quality training mode, the refresh power consumption of the DRAM 110 increases, but the probability of failures will decrease.

Figure 4:
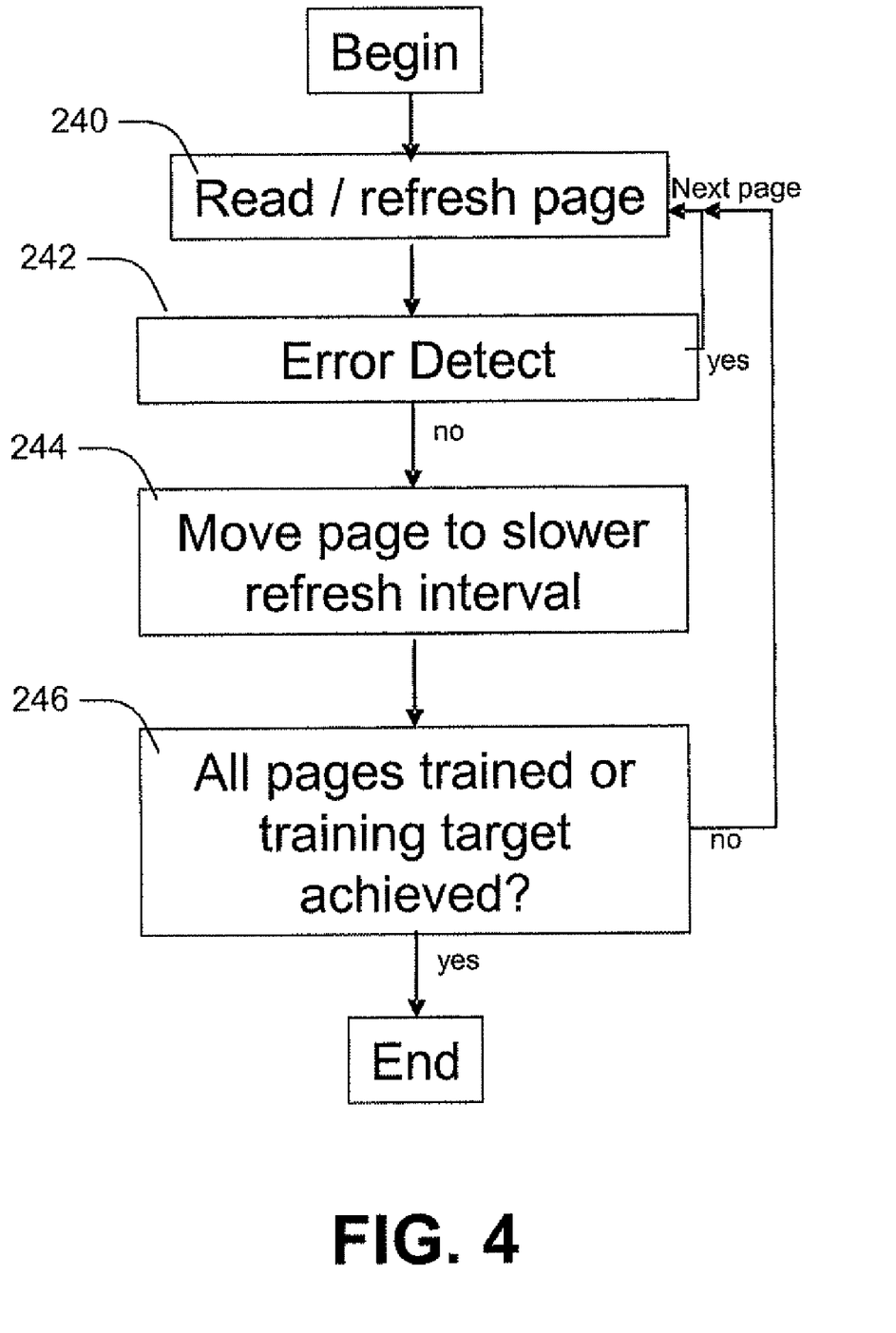
FIG. 4 is a flow diagram illustrating another process for determining refresh intervals according to an embodiment of the invention.

FIG. 4 illustrates an exemplary process for a "low power" training mode, in which refresh intervals are establish to minimize power consumption. When in the low power training mode, the system 100 will increase the refresh interval (slower refresh interval—extend the time between refreshes) for any refresh page 122 that does not exhibit a fail. As with the high quality training mode, in exemplary embodiments a plurality of refresh categories are established. Accordingly, in block 240, the page 122 is read/refreshed, and if the error detection device 130 does not detect an error in block 242, the page 122 is moved to the next slower refresh interval category in block 244. If an error is detected in block 242, the next page 122 is refreshed. As shown in block 244, this process is continued until all pages exhibit at least one fail or until a pre-determined number of pages are sorted into a certain refresh interval category. As a result of low power training, the refresh power consumption of the DRAM 100 could decrease, though the probability of errors may increase due to extended refresh intervals. Control of the training process and result handling and storage can be managed by the memory controller 128, or these functions can be located on the DRAM 110 itself.

Figure 5:
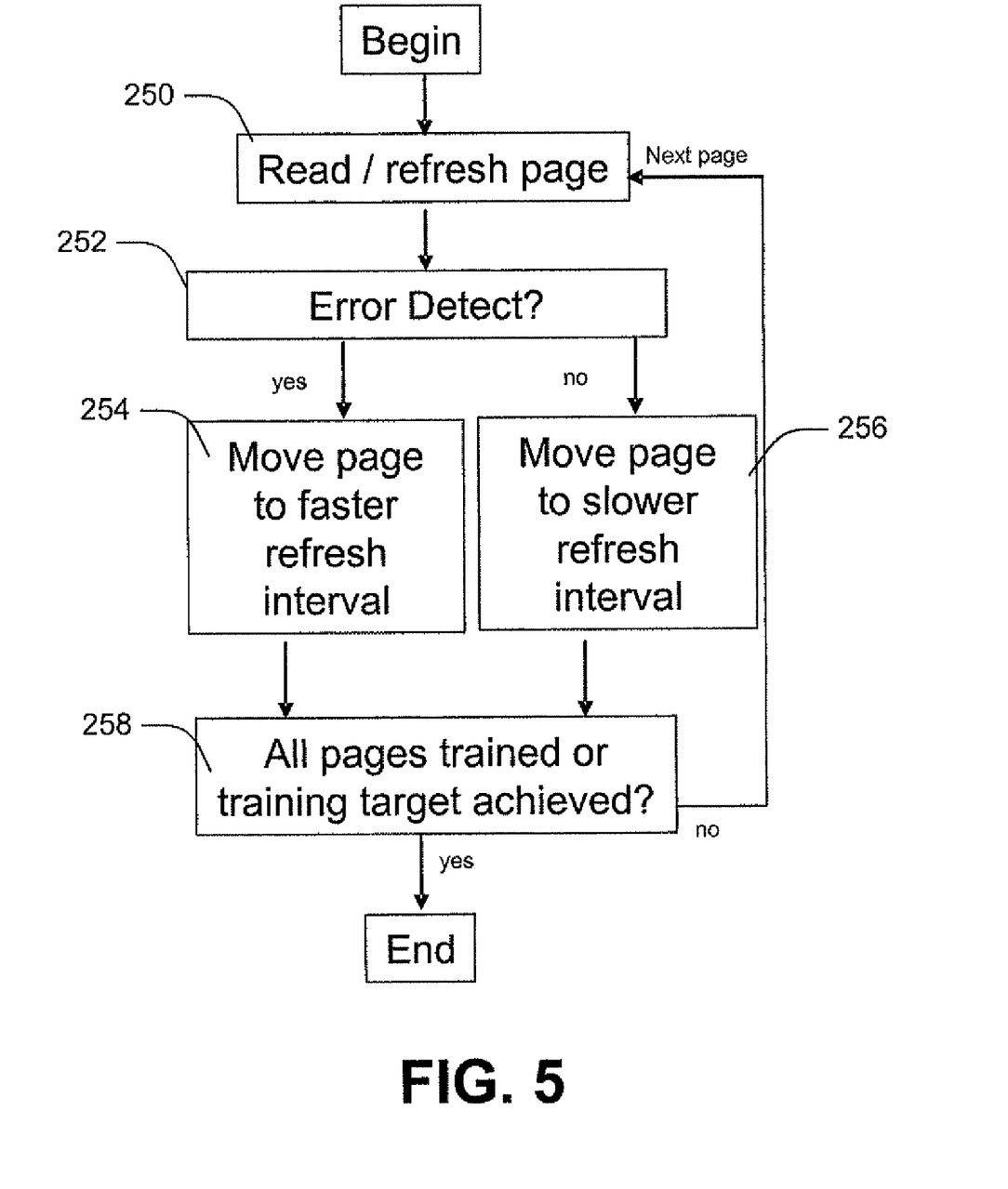
FIG. 5 is a flow diagram illustrating yet another process for determining refresh intervals according to an embodiment of the invention.

FIG. 5 illustrates an exemplary process for a "mixed" training mode, in which refresh intervals are adjusted both faster and slower to optimize overall quality and power consumption. In block 250, a page 122 is read/refreshed. If the error detection device 130 detects an error in block 252, the page 122 is moved to a faster refresh interval in block 254. If no error is detected in block 252, the page 122 is moved to a slower refresh interval in block 256. The training process continues until all pages are sorted into a refresh interval category, or until some other predetermined target is achieved, as determined in block 258.

Exemplary training modes include only two refresh interval categories, making it possible to store the refresh interval category using a single storage bit. However, any desired number of refresh interval categories can be established with an associated increase in storage capability. Moreover, three exemplary training modes have been disclosed in detail. One skilled in the art having the benefit of this specification, however, could develop any number of training schemes to assign refresh intervals to memory locations based on the particular application for the memory system.

When not in training mode, the refresh scheduler 140 (shown external to the DRAM 110 in FIG. 1, though it could also be implemented on the DRAM 110 itself or as part of the controller 128, for example) ensures that all pages 122 are refreshed as specified for their respective refresh interval categories. Moreover, while two basic training modes (plus a hybrid) were used in the exemplary implementations disclosed above, other aspects of the training processes can vary depending on the needs of the particular application of the memory system 100. For instance, in addition to determining whether the high quality or lower power training mode is appropriate (or some other devised training mode), a user may specify to what extreme the selected mode is pursued. The training process may be repeated until either no fails are detected or until each page has at least one failure, for example. Or, the training process could be repeated until some predetermined number of pages have been moved from their initial refresh category (such as repeating the process until 100 pages have moved from a slower to a faster refresh interval in the high quality training mode).

The training process can be conducted during any of several desired times. Failure information can be recorded during regular operation of the memory system 100, or the training process can take place during times where the memory system typically would not actively communicate with the host device. For example, DRAM devices have several modes designed to reduce power consumption while the memory device is not being used. Power-down mode is a low-power state of a DRAM during which no accesses occur, and different power-down modes are employed, such as power-down with and without self refresh. While data are typically not communicated to and from the DRAM 110 during such modes, implementations employing embodiments of the present invention are envisioned in which a power-down/training mode is established wherein the desired training process is conducted to assign refresh intervals to memory pages. Many types of host devices, such as a mobile phone, have standby modes where the memory system 100 would not be active, providing opportunities to conduct the training processes.

Figure 6:
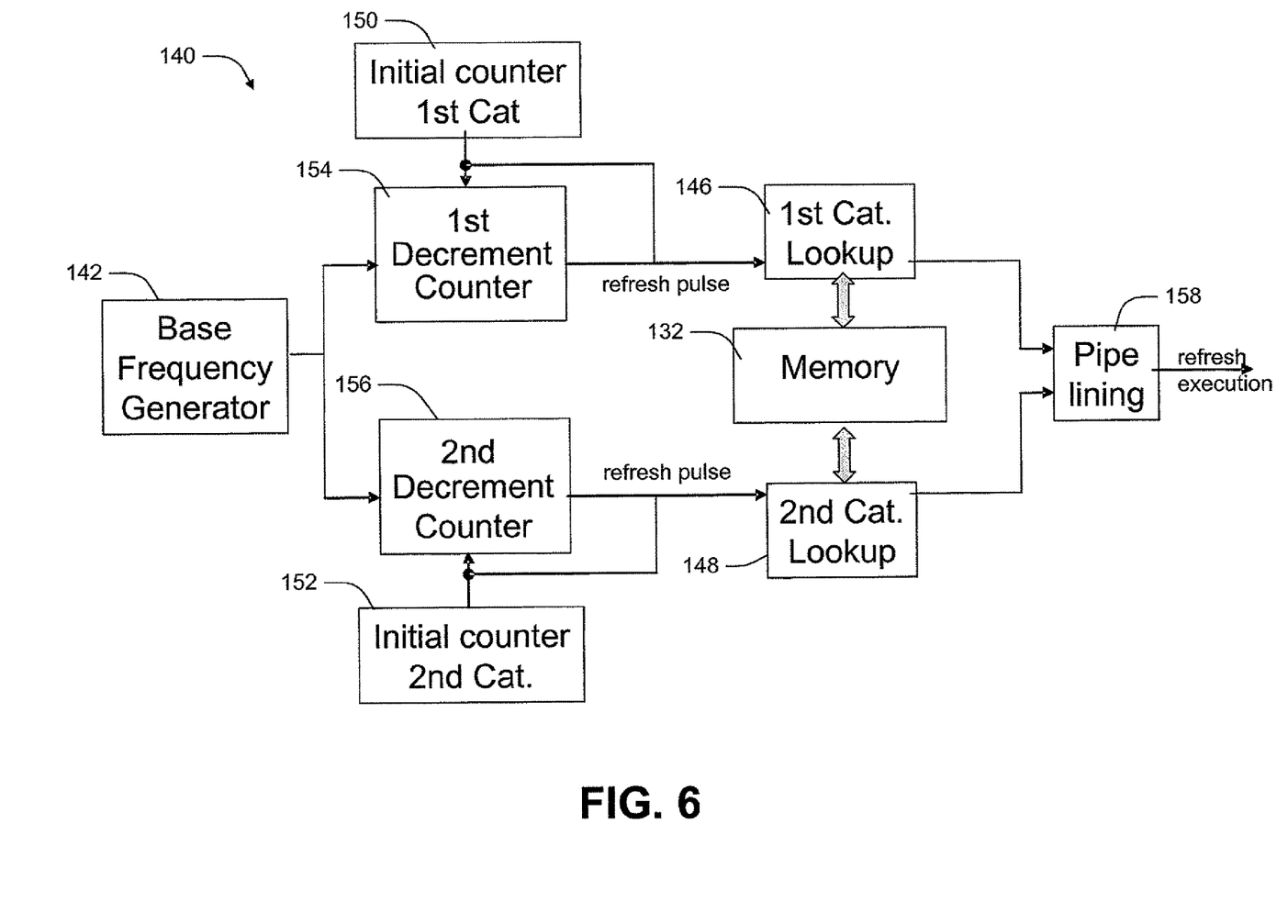
FIG. 6 is a block diagram conceptually illustrating a refresh scheduler according to an embodiment of the invention.

FIG. 6 is a block diagram conceptually illustrating the functions of an exemplary refresh scheduler 140. The scheduler 140 determines addresses and associated timing for refreshes and translates this information into commands that are provided to the DRAM 110 to actually execute the refresh the desired address at the desired time.

Pages 122 of the memory array 112 are assigned respective refresh intervals. This can occur during a training process such as the processes described above in conjunction with FIGS. 3-5, or refresh intervals could be initially set by the manufacturer, for example. In the illustrated embodiment, a flag is set for each page 122 corresponding to either a first or second refresh category. The first and second categories could simply comprise "fast" and "slow" refresh interval categories, for example. In other embodiments, additional refresh categories can be used, though this would require more than a simple single-bit flag to identify the assigned category.

The refresh scheduler 140 includes a frequency generator 142 that generates a predetermined base frequency. The frequency generator 142 can be external to the DRAM 110, or it can be configured on the DRAM 110 die via oscillators and dividers trimmed to generate the desired base frequency. The memory 132 stores the assigned refresh category for each memory address. The illustrated embodiment has two refresh interval categories, so a memory page 122 assigned the first refresh interval category could have its flag set to logic 0, while a memory page 122 assigned the second refresh interval category could have its flag set to logic 1. The first and second categories each have an associated lookup function 146, 148 that accesses the memory 132 and looks up the address of the next address, or page 122 belonging to its respective category. In other words, the first and second lookup functions 146, 148 search for the address of the next page 122 having the flag values for its respective category.

The disclosed system 100 refreshes memory cells using a plurality of refresh intervals. Rather than adding the complexity of generating multiple frequencies corresponding to the respective refresh intervals, the illustrated scheduler 140 operates with a single frequency provided by the base frequency generator 142. To properly time the refresh executions, each refresh category has an associated counter 150, 152 having an initial value based on the number of pages 122 residing in the associated first or second category. The counters 150, 152 are reduced by counter decrement functions 154, 156 using the base frequency provided by the frequency generator 142. When the particular counter 150, 152 reaches zero, the next page 122 identified by the respective address lookup 146, 148 is refreshed. The counter 150, 152 is immediately reset to its initial value and continues to be decremented 154, 156 by the base frequency 142.

The addresses for the pages 122 to be refreshed are fed from the lookup functions 146, 148 to a pipeline 158 to execute several refresh requests from the various categories. The pipeline 158 insures that refreshes are executed in the proper sequence and prevents refresh requests from becoming "lost." For example, since there are multiple branches (first and second lookup functions 146, 148) outputting addresses to be refreshed it is possible for the system to attempt to issue refresh requests to multiple addresses simultaneously. The pipeline 158 orders such requests, for example, in response to predetermined priorities).

The initial counter values 150, 152 for the respective refresh categories can be determined as follows:

Counter value=refresh interval×base frequency/number of-pages in category

For an implementation such as the exemplary embodiment illustrated in FIG. 6 with only "slow" and "fast" refresh interval categories, assume slow pages 122 are refreshed every 64 ms while fast pages are refreshed every 32 ms. If the base frequency is 100 MHz and 7,168 pages of a memory containing 8 k pages are initially sorted into the fast category, the initial counter value 150 for the fast category is 32 ms×100 MHz/7,168=446

If the remaining 1,024 pages are sorted into the slow category, the initial counter value 152 for the slow category is 64 ms×100 MHz/1,024=6,250

During subsequent training operations, it is possible for individual pages 122 to be switched from one category to another. Moreover, embodiments are envisioned in which the category assigned to individual pages 122 is changed during regular operation as a result of failures. If, for example, 100 pages are switched from the fast refresh category to the slow refresh category, the counter values would change to 32 ms×100 MHz/7,068=453 and 64 ms×100 MHz/1,124=5,694 for the fast and slow categories, respectively.

Thus, the scheduler 140 is able to pipeline pages 122 to be refreshed according to their proper category. There is a tradeoff between the resolution of the counter values and the base frequency. In practice, there is no need for a resolution that allows counter values to react to individual pages switching categories, for example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit device, comprising:
   an array containing a plurality of memory cells; and
   a refresh scheduler configured to refresh the memory cells according to a plurality of refresh intervals, wherein a first memory cell is assigned a first refresh interval, and a second memory cell is assigned a second refresh interval, the refresh intervals being assigned to one of first or second refresh interval categories;
   a memory accessible by the refresh scheduler, the memory storing the refresh intervals assigned to each of the memory cells;
   a frequency generator outputting a predetermined base frequency;
   first and second counters associated with the first and second refresh interval categories, the first and second counters each receiving an output of the frequency generator;
   the refresh scheduler generating refresh pulses for refreshing the memory pages in accordance with the associated refresh intervals in response to the counters, and wherein the refresh scheduler is configured to pipeline refresh executions in response to the indication of the first or second refresh interval.

2. The integrated circuit device of claim 1, wherein the plurality of refresh intervals are determined in response to refresh errors.

3. The integrated circuit device of claim 1, further comprising an error detection device, wherein the plurality of refresh intervals are determined in response to fail information output by the error detection device.

4. The integrated circuit device of claim 3, wherein the error detection device comprises an error correction circuit (ECC).

5. The integrated circuit device of claim 1, wherein the plurality of memory cells are arranged in an array including a plurality of pages.

6. The integrated circuit device of claim 5, wherein the first memory cell is in a first page and the second memory cell is in a second page, and wherein the first page is assigned the first refresh interval and the second page is assigned the second refresh interval.

7. A refresh scheduler for a memory device including a plurality of memory pages, comprising:
   a memory accessible by the refresh scheduler, the memory storing a plurality of memory page addresses and associated refresh intervals, the refresh intervals being assigned to one of first or second refresh interval categories;
   a frequency generator outputting a predetermined base frequency;
   first and second counters associated with the first and second refresh interval categories, the first and second counters each receiving an output of the frequency generator;
   the refresh scheduler generating refresh pulses for refreshing the memory pages in accordance with the associated refresh intervals in response to the counters, and wherein the refresh scheduler is configured to pipeline refresh executions in response to the indication of the first or second refresh interval.

8. The refresh scheduler of claim 7, further comprising an error detection device, wherein the plurality of refresh intervals are determined in response to the error detection device.

9. The refresh scheduler of claim 8, wherein the error detection device comprises an error correction circuit (ECC).

10. A system, comprising:
    a host device;
    a memory array connected to the host device, the memory array containing a plurality of memory cells, an error detection device; and a refresh scheduler configured to refresh the memory cells according to a plurality of refresh intervals determined in response to the error correction device, wherein a first memory cell is refreshed according to a first refresh interval and a second memory cell is refreshed according to a second refresh interval; and
    a memory accessible by the refresh scheduler, the memory storing the refresh intervals assigned to each of the memory cells, the refresh intervals being assigned to one of first or second refresh interval categories;
    a frequency generator outputting a predetermined base frequency;
    first and second counters associated with the first and second refresh interval categories, the first and second counters each receiving an output of the frequency generator;
    the refresh scheduler generating refresh pulses for refreshing the memory pages in accordance with the associated refresh intervals in response to the counters, and wherein the refresh scheduler is configured to pipeline refresh executions in response to the indication of the first or second refresh interval.

11. The system of claim 10, wherein the error detection device comprises an error correction circuit (ECC).

12. The system of claim 10, wherein the memory includes a memory controller, wherein the error correction device and the refresh scheduler are connected to the controller.

13. The system of claim 10, where the first memory cell is in a first memory page and the second memory cell is in a second memory page in the array, and wherein the first memory page is assigned the first refresh interval and the second memory page is assigned the second refresh interval.

14. A method of refreshing pages of a memory device, comprising:
    establishing a plurality of refresh intervals;
    assigning a first refresh interval to a first page and a second refresh interval to a second page of the memory device;
    assigning the refresh intervals to one of first or second refresh interval categories;
    storing the established refresh intervals assigned to the first and second pages in a memory;
    outputting a predetermined base frequency to first and second counters associated with the first and second refresh interval categories;
    generating refresh pulses for refreshing the memory pages in accordance with the associated refresh intervals in response to the counters;
    pipelining refresh executions in response to the indication of the first or second refresh interval; and
    refreshing the pages of the memory device according to the assigned refresh intervals stored in the memory.

15. The method of claim 14, wherein assigning one of the first and second refresh intervals includes assigning the refresh interval to a page in response to an occurrence of a data error when the page is refreshed.

16. The method of claim 15, wherein assigning the first and second refresh intervals includes decreasing the refresh interval for a page in response to an occurrence of a data error when the page is refreshed.

17. The method of claim 15, wherein assigning the first and second refresh intervals includes increasing the refresh interval for a page if a data error is not detected when the page is refreshed.

18. The method of claim 15, wherein the second refresh interval is faster than the first refresh interval, wherein the first interval is assigned to a page if a data error is not detected when the page is refreshed.

19. The method of claim 15, wherein the second refresh interval is faster than the first refresh interval, wherein the second interval is assigned to a page in response to an occurrence of a data error when the page is refreshed.

* * * * *